(12) United States Patent
Lee (10) Patent No.: US 6,356,489 B2
(45) Date of Patent: Mar. 12, 2002

(54) INTEGRATED CIRCUIT MEMORY DEVICES HAVING CIRCUITS THEREIN THAT PRESERVE MINIMUM /RAS TO /CAS DELAYS

(75) Inventor: Sang-bo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/766,358

(22) Filed: Jan. 19, 2001

(30) Foreign Application Priority Data

Jan. 28, 2000 (KR) .............................................. 00-4250

(51) Int. Cl.$^7$ ................................................. G11C 7/00
(52) U.S. Cl. ........................ 365/198; 365/194; 365/233
(58) Field of Search ........................... 365/189.05, 194, 365/198, 230.08, 233, 233.5

(56) References Cited

U.S. PATENT DOCUMENTS

| 4,573,145 A | * | 2/1986 | Ozawa | 365/194 |
|---|---|---|---|---|
| 4,876,670 A | * | 10/1989 | Nakabayashi et al. | 365/194 |
| 5,031,150 A | * | 7/1991 | Ohsawa | 365/194 |
| 5,479,128 A | * | 12/1995 | Jan et al. | 365/194 |
| 5,768,177 A | * | 6/1998 | Sakuragi | 365/194 |
| 5,841,707 A | * | 11/1998 | Cline et al. | 365/194 |
| 6,005,824 A | * | 12/1999 | Crafts | 365/194 |
| 6,111,812 A | * | 8/2000 | Gans et al. | 365/194 |

* cited by examiner

Primary Examiner—Tan T. Nguyen
(74) Attorney, Agent, or Firm—Myers Bigel Sibley & Sajovec (57) ABSTRACT

A semiconductor memory device having an operation delay function of a CAS command, and a buffer and a signal transmission circuit which are applied to the semiconductor memory device, are provided. The signal transmission circuit includes a plurality of transmission units each for delaying an input signal by a different number of delay clock cycles. The transmission unit includes a transmission switch and a clock delay unit. The semiconductor memory device can delay a received signal for different numbers of delay clocks in response to first through third control signals. Therefore, a predetermined delay time between when a row-type command is received and when a column-type command is received can be shortened.

20 Claims, 7 Drawing Sheets

INTEGRATED CIRCUIT MEMORY DEVICES HAVING CIRCUITS THEREIN THAT PRESERVE MINIMUM /RAS TO /CAS DELAYS

This application claims priority to Korean Application No. 2000-4250, filed Jan. 28, 2000, the disclosure of which is hereby incorporated herein by reference.

BACKGROUND OF THE INVENTION

1. Field of the Invention

The present invention relates to semiconductor memory devices, and more particularly, to a semiconductor memory device in which a point in time when a column-type command such as a column address strobe (CAS) command is input can be varied from a point in time when a row-type command such as a row address strobe (RAS) command is input.

2. Description of the Related Art

A The input and output operations of semiconductor memory devices are generally controlled by combination of a plurality of signals. For example, the data input and output operations of semiconductor memory devices are controlled by a chip select signal (hereinafter, referred to as a CS signal), a column address strobe signal (hereinafter, referred to as a CAS signal), and a write enable signal (hereinafter, referred to as a WE signal). Also, semiconductor memory devices receive the CS signal, the CAS signal and the WE signal via pins connected to the outside. The CS signal, the CAS signal and the WE signal received via the external pins are buffered by buffers.

Synchronous DRAMs operate in synchronization with an external clock signal which is input externally to the synchronous DRAMs. Also, the synchronous DRAMs, in which the CS signal, the CAS signal and the WE signal are input to and combined in corresponding buffers, generate signals associated with reading and writing in synchronization with the external clock signal.

The synchronous DRAMs receive row-type commands and then column-type commands such as the CS signal, the CAS signal and the WE signal. However, conventional synchronous DRAMs require at least a command delay time, a so-called 'tRCD$_{min}$ (RAS to CAS)', between the input of a row-type command and the input of a column-type command. That is, in conventional synchronous DRAMs, column-type commands are received after a period of 'tRCD' after row activation starts in response to received row-type commands, since data input and output is not possible until memory cells connected to a row selected after a row command is input share charge and detect charge.

That is, conventional synchronous DRAMs have a limit in unavoidably requiring a time interval of tRCD$_{min}$ between a point in time when a row-type command is received and a point in time when a column-type command is received.

SUMMARY OF THE INVENTION

An object of the present invention is to provide a semiconductor memory device in which the time interval between a point in time when a row-type command is received and a point in time when a column-type command is received can be shorter than a predetermined minimum time interval tRCD$_{min}$.

Another object of the present invention is to provide a buffer and a signal transmission circuit which are applied to the semiconductor memory device.

To achieve the first object, there is provided a semiconductor memory device including a mode set register, a /CAS buffer, a /CS buffer and a /WE buffer. The mode set register can program the delay time from when a row address strobe (RAS) command is input to when a column address strobe (CAS) command is input, and provides a plurality of control signals. In the mode set register, one among the plurality of control signals is activated corresponding to the delay time. The /CAS buffer receives and buffers a predetermined /CAS signal. In the /CAS buffer, the /CAS signal is delayed for a predetermined number of delay clock cycles in response to the control signal. The /CS buffer receives and buffers a predetermined /CS signal. In the /CS buffer, the /CS signal is delayed for the number of delay clock cycles in response to the control signal. The /WE buffer receives and buffers a predetermined /WE signal. In the /WE buffer, the /WE signal is delayed for the number of delay clocks in response to the control signal.

To achieve the second object, there is provided a buffer for a semiconductor memory device having a mode register set circuit, including a signal transmission unit for delaying a received signal for a predetermined number of delay clock cycles and transmitting the received signal, wherein the number of delay clock cycles is determined in response to predetermined control signals which are generated from the mode register set circuit.

To achieve the second object, there is provided a signal transmission circuit for transmitting a received signal, including a plurality of transmission units each having a different number of delay clock cycles, for delaying and transmitting the received signal. At least one of the transmission units includes: a transmission switch for transmitting the received signal in response to a corresponding control signal; and a clock delay unit which is enabled in response to the control signal, and delays a signal received from the transmission switch for the delay clock cycles and transmits the delayed signal in response to a predetermined clock signal.

According to a semiconductor memory device of the present invention, the time for which a column-type command is delayed after a row-type command is received can be reduced.

BRIEF DESCRIPTION OF THE DRAWINGS

The above objects and advantage of the present invention will become more apparent by describing in detail a preferred embodiment thereof with reference to the attached drawings in which.

DESCRIPTION OF THE PREFERRED EMBODIMENT

Attached drawings for illustrating a preferred embodiment of the present invention, and the contents written on the attached drawings must be referred to in order to gain a sufficient understanding of the merits of the present invention and the operation thereof and the objectives accomplished by the operation of the present invention.

Hereinafter, the present invention will be described in detail by explaining a preferred embodiment of the present invention with reference to the attached drawings. Like reference numerals in the drawings denote the same members.

Figure 1:
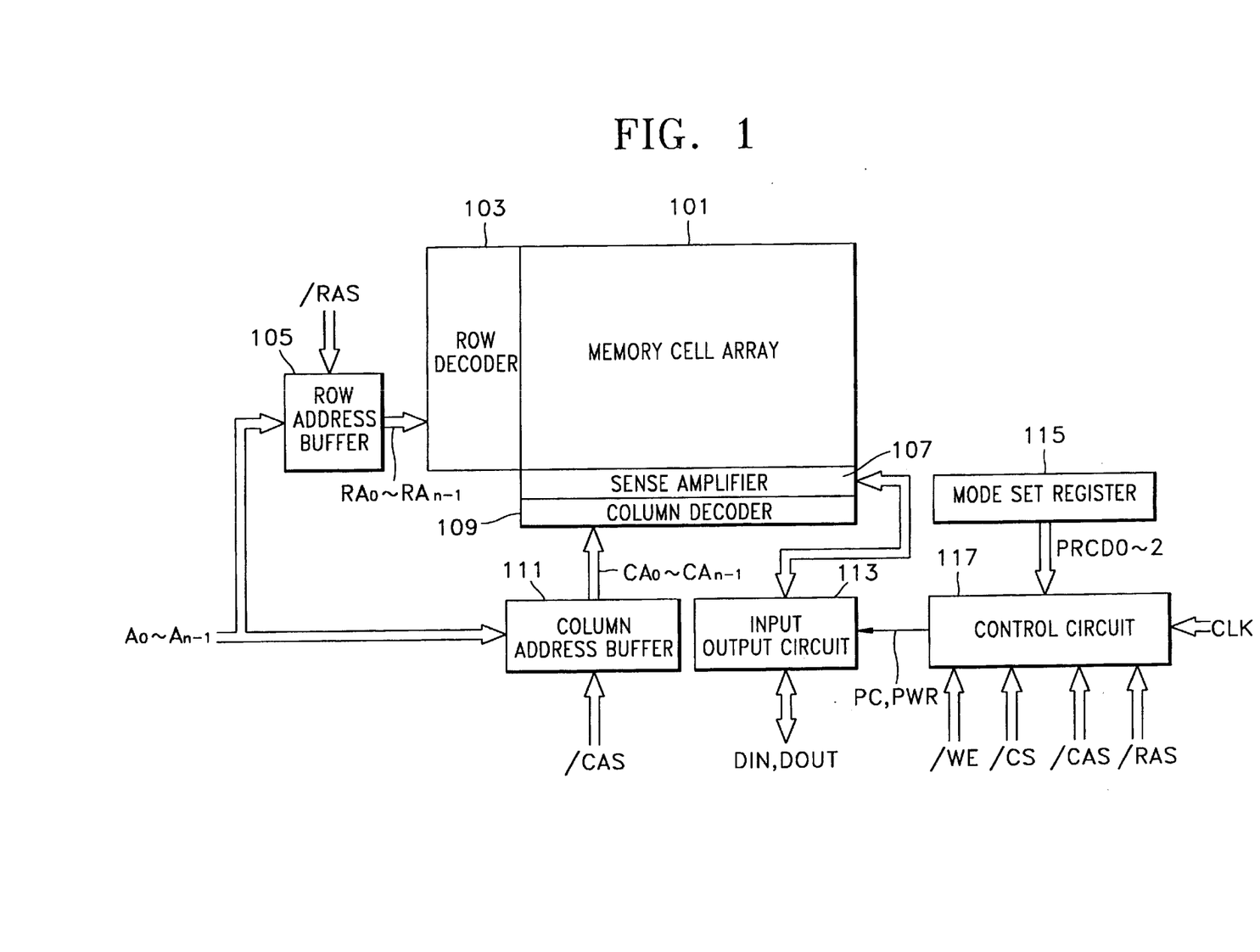
FIG. 1 is a block diagram schematically illustrating a semiconductor memory device having an operation delay function of a column address strobe (CAS) command, according to an embodiment of the present invention.

Referring to FIG. 1, a semiconductor memory device according to a preferred embodiment of the present invention includes a memory cell array 101, a row decoder 103, a row address buffer 105, a sense amplifier 107, a column decoder 109, a column address buffer 111, an input output circuit 113, a mode set register 115 and a control circuit 117.

The memory cell array 101 includes a plurality of memory cells arrayed in rows and columns. The row decoder 103 selects a row from the memory cell array 101 in response to row addresses $RA_0$ through $RA_{n-1}$. The row address buffer 105 buffers external addresses $A_0$ through $A_{n-1}$, and generates the row addresses $RA_0$ through $RA_{n-1}$ in response to a row address strobe (/RAS) signal.

The column decoder 109 selects a column from the memory cell array 101 in response to column addresses $CA_0$ through $CA_{n-1}$. The column address buffer 111 buffers the external addresses $A_0$ through $A_{n-1}$, and generates the column addresses $CA_0$ through $CA_{n-1}$ in response to a column address strobe (/CAS) signal. The sense amplifier 107, which includes a plurality of sense amplification units, transmits data between the input output circuit 113 and a cell in the memory cell array 101 using a sense amplification unit selected by the column addresses $CA_0$ through $CA_{n-1}$.

The mode set register 115 generates first, second and third control signals PRCD0, PRCD1 and PRCD2 which are programmed in a mode register set (MRS) operation. One among the first, second and third control signals PRCD0, PRCD1 and PRCD2 is at a high level.

The control circuit 117 receives a clock signal CLK, a write enable signal /WE, a chip selection signal /CS, a column address strobe signal /CAS, and a row address strobe signal /RAS. Also, the control circuit 117 generates an internal CAS signal PC and an internal write enable signal PWR in response to a row address strobe signal /RAS and the first, second and third control signals PRCD0, PRCD1 and PRCD2.

The internal CAS signal PC and the internal write enable signal PWR are provided to the input output circuit 113, and control the input and output of data. In FIG. 1, reference characters DIN and DOUT denote input data and output data, respectively.

Figure 2:
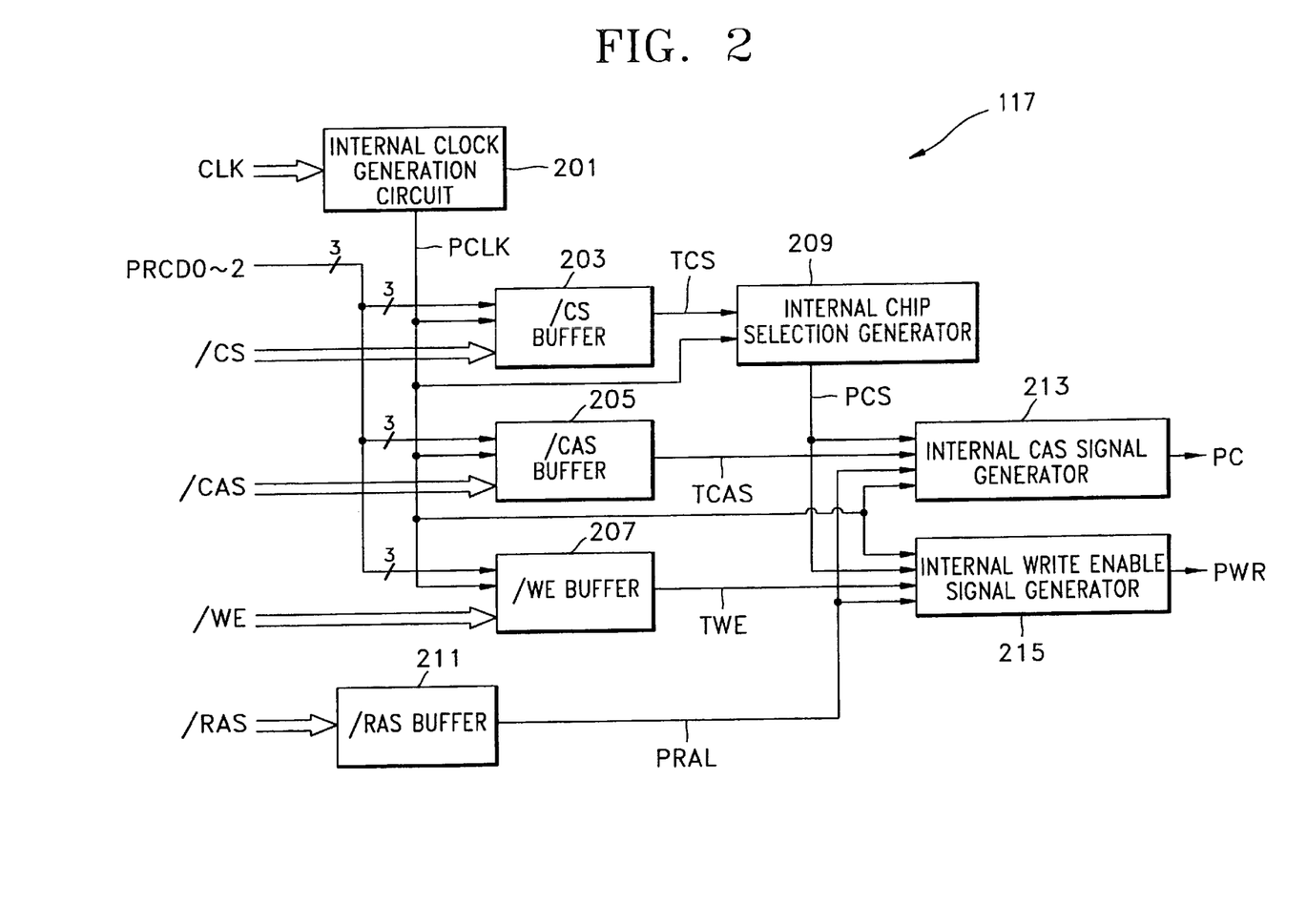
FIG. 2 is a block diagram of the control circuit of FIG. 1.

FIG. 2 is a block diagram of the control circuit 117 of FIG. 1. Referring to FIG. 2, the control circuit 117 includes an internal clock generation circuit 201, a /CS buffer 203, a /CAS buffer 205, a /WE buffer 207, an internal chip selection generator 209, a /RAS buffer 211, an internal CAS signal generator 213 and an internal write enable signal generator 215.

The internal clock generation circuit 201 generates an internal clock signal PCLK having a constant pulse width, in synchronization with an external clock signal CLK.

The /CS buffer 203 receives the chip selection signal /CS and generates an initial chip selection signal TCS which can be delayed for a predetermined number of clock cycles with respect to the chip selection signal /CS. The number of delay clock cycles can be determined to be zero clock cycles, one clock cycle, two clock cycles, etc. of the internal clock signal PCLK, in response to the first, second and third control signals PRCD0, PRCD1 and PRCD2 generated by the mode set register 115 of FIG. 1.

The /CAS buffer 205 receives the column address strobe signal /CAS to generate an initial CAS signal TCAS which can be delayed for a predetermined number of clock cycles with respect to the column address strobe signal /CAS. The /WE buffer 207 receives the write enable signal /WE to generate an initial write enable signal TWE which can be delayed for a predetermined number of delay clocks with respect to the write enable signal /WE.

The number of delay clock cycles for each of the /CAS buffer 205 and the /WE buffer 207 can be determined to be zero clock cycles, one clock cycle, two clock cycles, etc. with respect to the internal clock signal PCLK, similar to the number of delay clocks for the /CS buffer 203.

The internal chip selection generator 209 receives the initial chip selection signal TCS, and generates an internal chip selection signal PCS in response to the internal clock signal PCLK.

The /RAS buffer 211 receives a row address strobe signal /RAS to generate an initial RAS signal PRAL. The initial RAS signal PRAL goes to a high level when the level of the column address strobe signal /CAS is changed from a low level to a high level. The initial RAS signal PRAL is still at the high level when a column-type command is input.

The internal CAS signal generator 213 receives the initial CAS signal TCAS to generate an internal CAS signal PC. The internal CAS signal PC is generated in response to the internal clock signal PCLK when the internal chip selection signal PCS and the initial RAS signal PRAL are at a high level.

The internal write enable signal generator 215 receives the initial write enable signal TWE and generates an internal write enable signal PWR. The internal write enable signal PWR is generated in response to the internal clock signal PCLK when the internal chip selection signal PCS and the initial RAS signal PRAL are at a high level.

Figure 3:
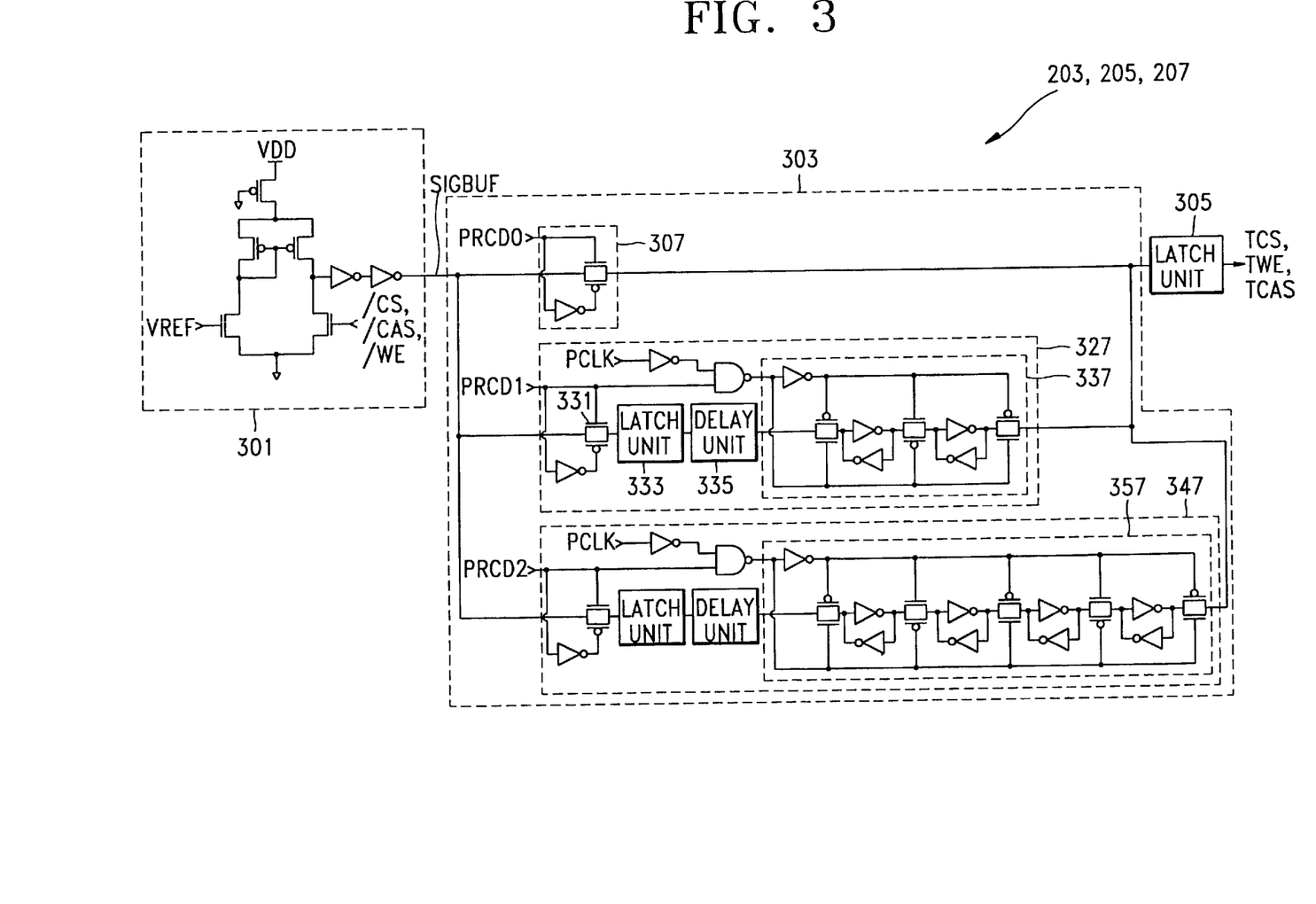
FIG. 3 is a block diagram of the /CS buffer of FIG. 2 to which the /CAS buffer and the /WE buffer of FIG. 2 can be applied.

FIG. 3 is a block diagram of the /CS buffer 203 of FIG. 2. It is also used to illustrate the /CAS buffer 205 and the /WE buffer 207 of FIG. 2. In this specification, only the /CS buffer 203 will be described for convenience of explanation.

Referring to FIG. 3, the /CS buffer 203 includes a buffer unit 301, a signal transmission unit 303 and a latch unit 305. The buffer 301 receives and buffers a chip selection signal /CS, and generates a buffered signal SIGBUF and outputs it to the signal transmission unit 303. The signal transmission unit 303 delays the buffered signal SIGBUF by a predetermined number of clock cycles. The number of delay clock cycles is determined by the first, second and third control signals PRCD0, PRCD1 and PRCD2 supplied from the mode set register 115 of FIG. 1. The first, second and third control signals PRCD0, PRCD1 and PRCD2 are values programmed in the mode set register 115 upon mode register setting. The first control signal PRCD0 goes to high levels when a column-type command is not delayed, the second control signal PRCD1 goes to high levels when the column-type command is delayed for one clock cycle, and the third control signal PCRD2 goes to high levels when the column-type command is delayed for two clock cycles.

That is, when the first control signal PRCD0 is at the high level, a semiconductor memory device according to the present invention operates immediately when a column-type command is input. Thus, when the first control signal PRCD0 is at the high level, the semiconductor memory device according to the present invention operates without delay, similar to existing semiconductor memory devices. Also, when the second control signal PRCD1 is at the high level, the semiconductor memory device according to the present invention is delayed for one clock cycle from when a column-type command is input, and then starts operating. Thus, the semiconductor memory device according to the present invention can operate normally even though a column-type command is received one clock cycle earlier than when it must be received in existing semiconductor memory devices. Furthermore, when the third control signal PRCD2 is at the high level, the semiconductor memory device according to the present invention can operate normally even though a column-type command is received two clock cycles earlier than when it must be received in existing semiconductor memory devices.

To be more specific, the signal transmission unit 303 includes first, second and third transmission units 307, 327 and 347. The first transmission unit 307 provides the buffered signal SIGBUF to the latch unit 305 without delay when the first control signal PRCD0 is at the high level. The second transmission unit 327 delays the buffered signal SIGBUF for one clock cycle of the internal clock signal PCLK and provides the delayed buffered signal SIGBUF to the latch unit 305 when the second control signal PRCD1 is at the high level.

To be more specific, the second transmission unit 327 includes a transmission switch 331, a latch unit 333, a delay unit 335 and a clock delay unit 337. The transmission switch 331 transmits the buffered signal SIGBUF in response to a high level second control signal PRCD1. The buffered signal SIGBUF sequentially passes through the latch unit 333 and the delay unit 335, and is transmitted to the clock delay unit 337. The clock delay unit 337 transmits the output signal of the delay unit 335 to the latch unit 305 in response to the internal clock signal PCLK. That is, the output signal of the delay unit 335, which is input to the clock delay unit 337, is transmitted to the latch unit 305 when the level of the internal clock signal PCLK changes from a high level to a low level and again to a high level. Thus, the clock delay unit 337 delays the received signal for one clock cycle of the internal clock signal PCLK.

The latch unit 333 and the delay unit 335 in the second transmission unit 327 control a set-up time and a hold time between a column-type command signal and an internal clock signal PCLK.

The third transmission unit 347 delays the buffered signal for two clock cycles of the internal clock signal PCLK when the third control signal PRCD2 is at the high level, and then provides the buffered signal to the latch unit 305.

The configuration of the third transmission unit 347 is similar to that of the second transmission unit 337 except that a delay clock unit 357 included in the third transmission unit 347 delays a received signal for two clock cycles of the internal clock signal PCLK. Thus, the second transmission unit 347 will not be described in detail.

Figure 4:
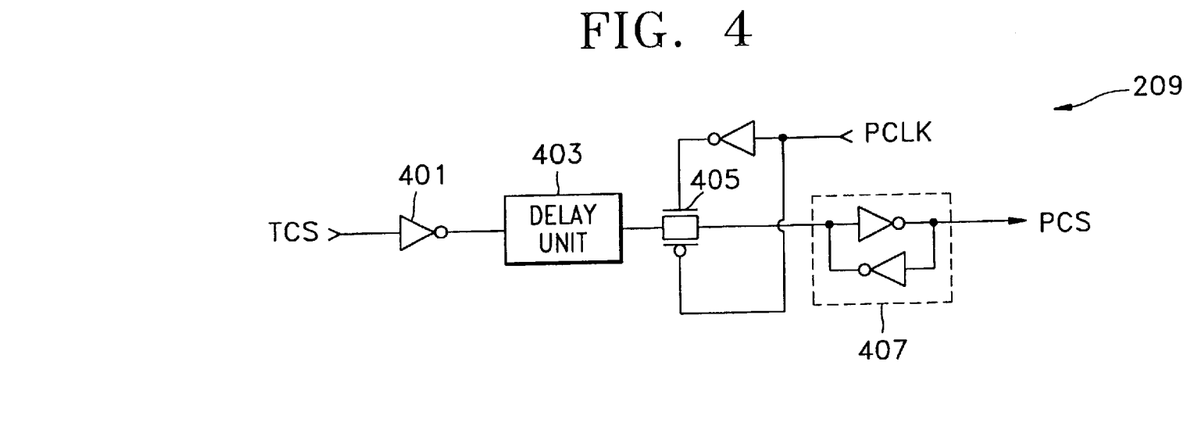
FIG. 4 is a circuit diagram illustrating the internal chip selection generator of FIG. 2 in more detail.

FIG. 4 is a circuit diagram illustrating the internal chip selection generator 209 of FIG. 2 in more detail. Referring to FIG. 4, the internal chip selection generator 209 includes an inverter 401, a delay unit 403, a transmission transistor 405 and a latch unit 407, and latches an initial chip selection signal TCS and generates an internal chip selection signal PCS in response to a high level internal clock signal PCLK.

Figure 5:
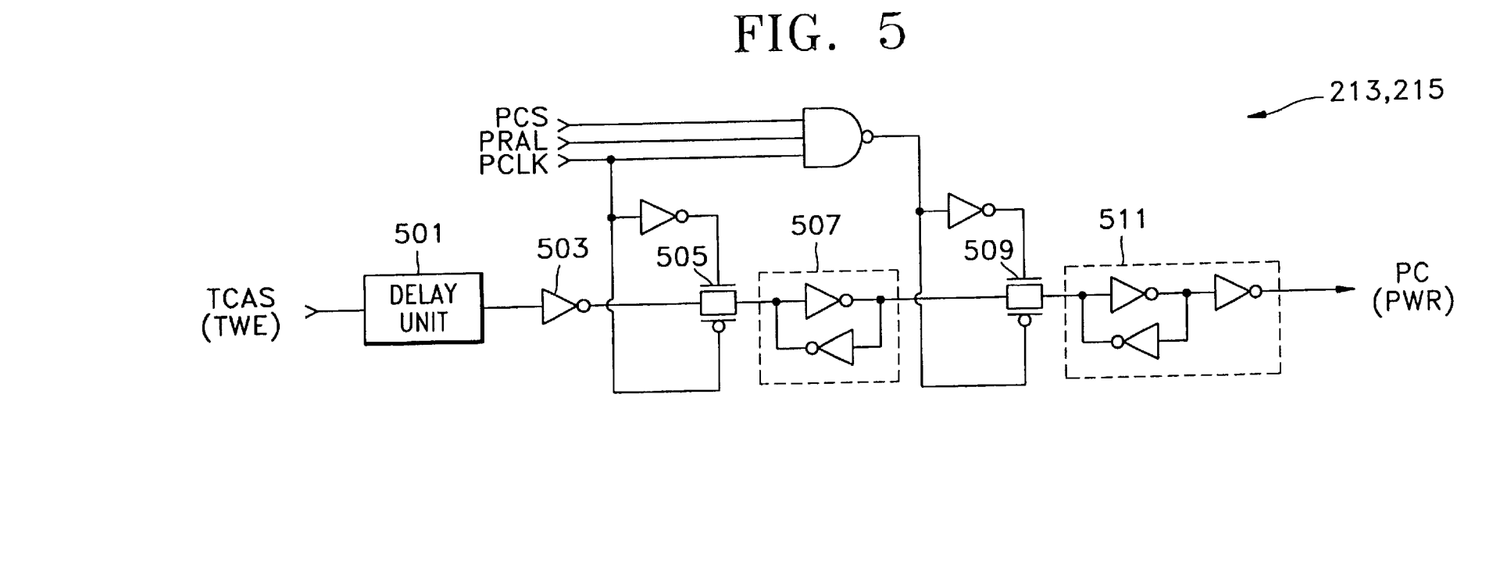
FIG. 5 is a block diagram illustrating the internal CAS signal generator of FIG. 2 in more detail, to which the internal write enable signal generator of FIG. 2 can be applied.

FIG. 5 is a block diagram illustrating the internal CAS signal generator 213 of FIG. 2 in more detail. It is also used to illustrate the internal write enable signal generator 215 of FIG. 2. In this specification, only the internal CAS signal generator 213 will be described for convenience of explanation.

Referring to FIG. 5, the internal CAS signal generator 213 includes a delay unit 501, an inverter 503, a first transmission transistor 505, a first latch unit 507, a second transmission transistor 509 and a second latch unit 511. The internal CAS signal generator 213 is enabled when the initial RAS signal PRAL and the internal chip selection signal PCS are at high levels. The first transmission transistor 505 transmits an initial CAS signal TCAS which has passed through the delay unit 501 and the inverter 503, in response to the falling edge of the internal clock signal PCLK. The first latch unit 507 latches a signal received from the first transmission transistor 505.

The second transmission transistor 509 transmits a signal which has been latched by the first latch unit 507, in response to the rising edge of the internal clock signal PCLK. The second latch unit 511 latches a signal received from the second transmission transistor 509.

Figure 6:
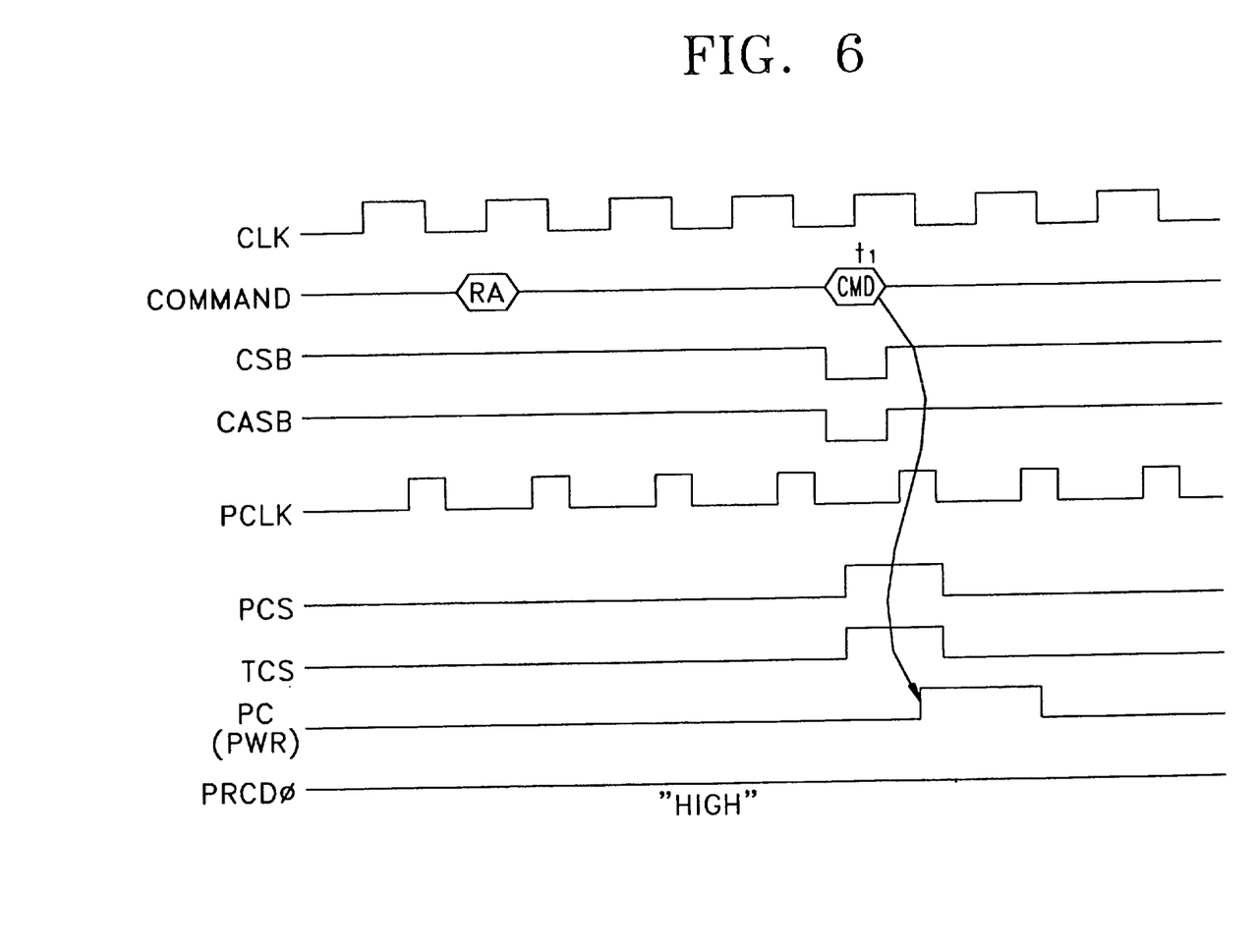
FIG. 6 is a timing diagram of the signals of FIG. 2 when a first control signal is high.

FIG. 6 is a timing diagram of the signals of FIG. 2 when the first control signal PRCD0 is at the high level. Referring to FIG. 6, the internal CAS signal PC and the internal write enable signal PWR are activated to a high level with a zero clock cycle delay from a point in time t1 when a column-type command is input. Thus, it can be seen from FIG. 6 that the column-type command is input without delay.

Figure 7:
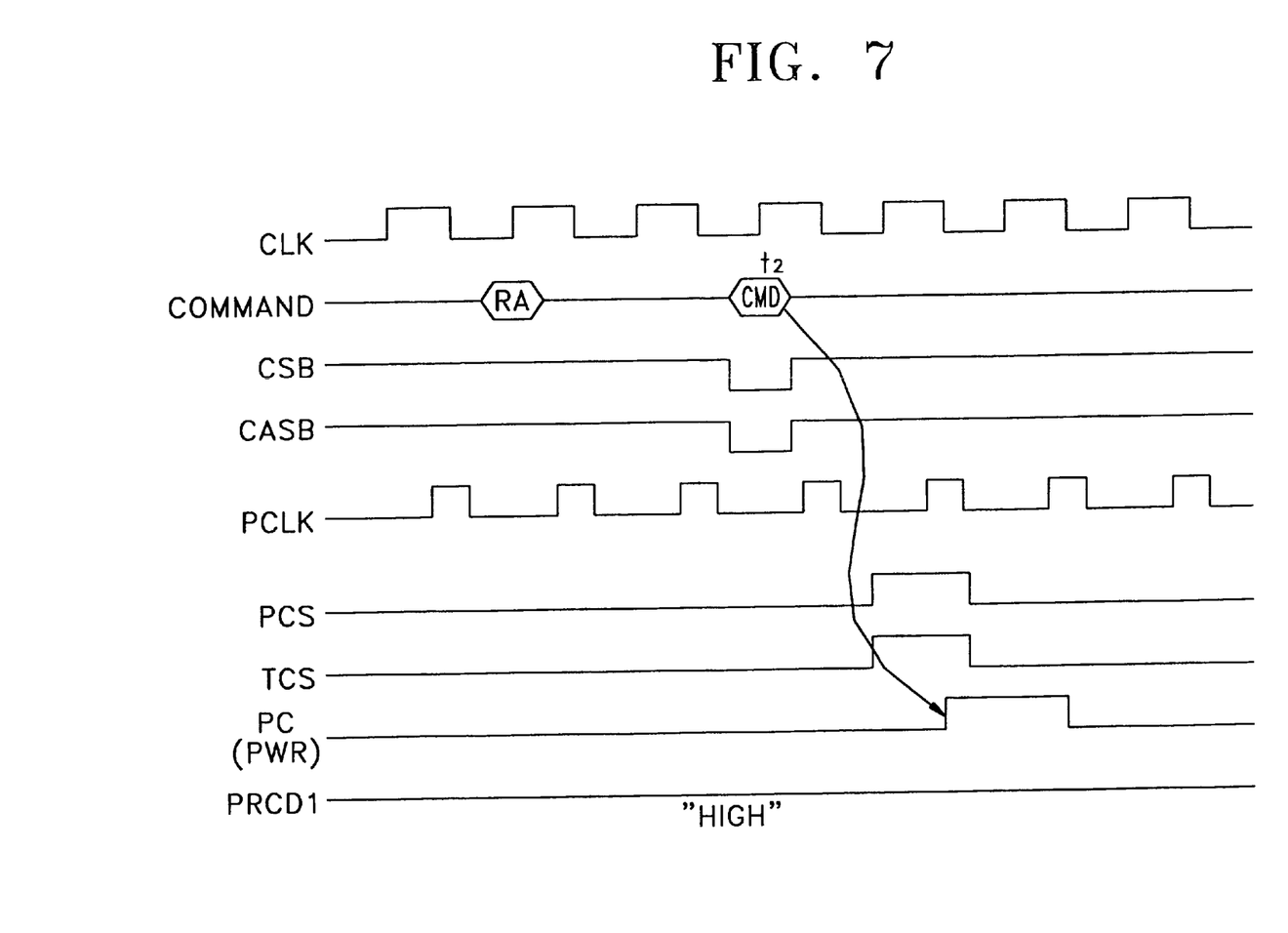
FIG. 7 is a timing diagram of the signals of FIG. 2 when a second control signal is high.

FIG. 7 is a timing diagram of the signals of FIG. 2 when the second control signal PRCD1 is at the high level. Referring to FIG. 7, the internal CAS signal PC and the internal write enable signal PWR are activated to a high level after being delayed for one clock cycle from a point in time t2 when a column-type command is input. Thus, it can be seen from FIG. 7 that the column-type command according to the present invention is executed the same as a column-type command in the prior art which is received after being delayed for one clock cycle relative to the column-type command according to the present invention.

Figure 8:
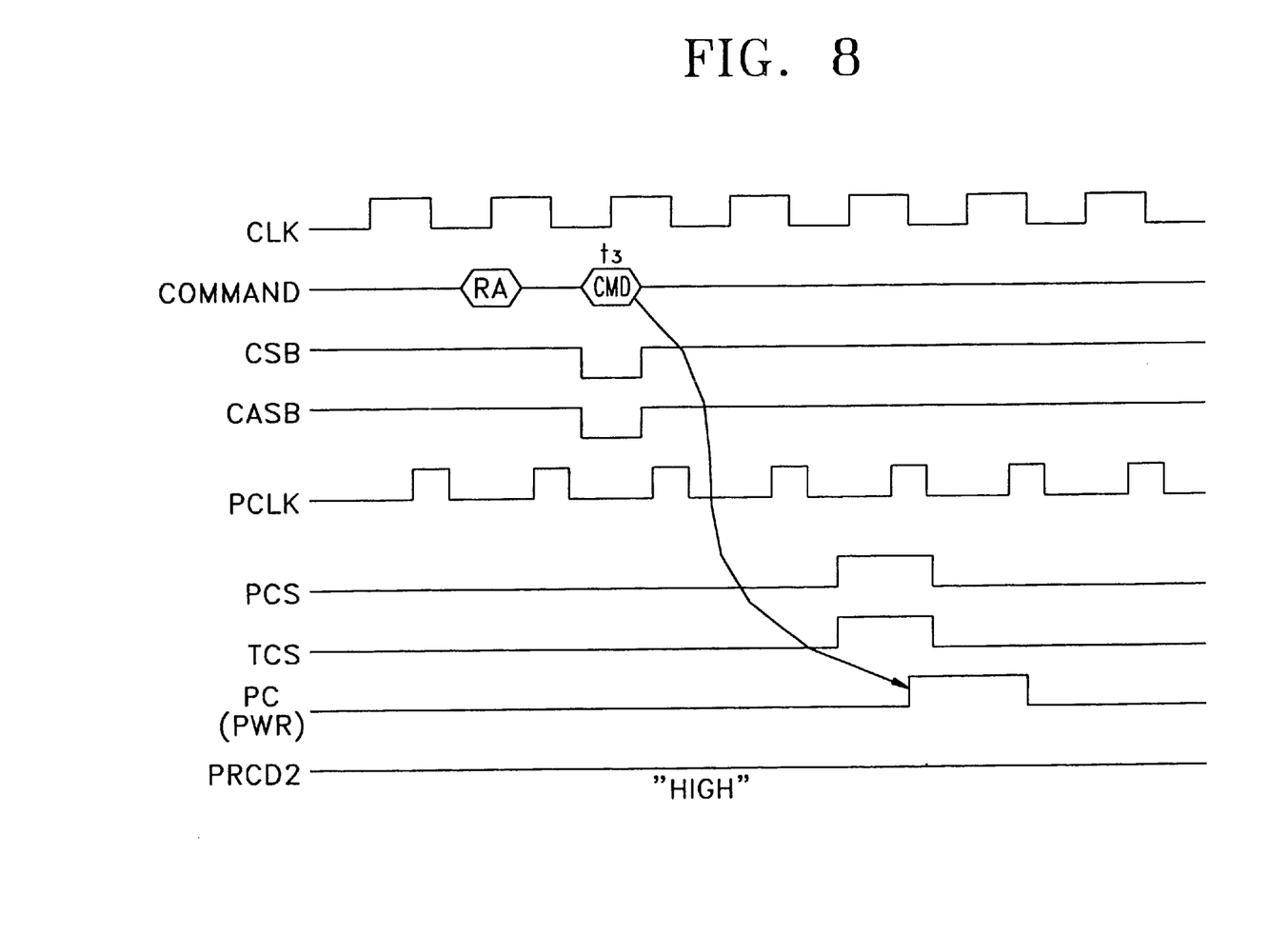
FIG. 8 is a timing diagram of the signals of FIG. 2 when a third control signal is high.

FIG. 8 is a timing diagram of the signals of FIG. 2 when the third control signal PRCD2 is at the high level. Referring to FIG. 8, the internal CAS signal PC and the internal write enable signal PWR are activated to a high level after being delayed for two clock cycles from a point in time t3 when a column-type command is input. Thus, it can be seen from FIG. 8 that the column-type command according to the present invention is executed the same as a column-type command in the prior art which is received after being delayed for two clock cycles relative to the column-type command according to the present invention.

The semiconductor memory device according to an embodiment of the present invention can vary the delay from a point in time when a row-type command is received to a point in time when a column-type command is received. That is, a buffer which receives a chip selection signal /CS, a column address strobe signal /CAS, and a write enable signal /WE is controlled by the first, second and third control signals PRCD0, PRCD1 and PRCD2 provided from the mode set register 115. Therefore, the point in time when an internal CAS signal PC and an internal write enable signal PWR are activated can vary.

A technique for varying the point in time when a column-type command is to be received, according to the technical spirit of the present invention, is more simple than existing control techniques. Also, in the semiconductor memory device according to the present invention, even if a column-type command is applied without the control of tRCD, the column-type command is internally delayed, so that tRCD is maintained.

According to the semiconductor memory device of the present invention, the point in time when a column-type command is input can vary. Also, a column-type command is internally delayed regardless of tRCD, so that tPCD can be internally maintained. Therefore, the delay from when a row-type command is received to when a column-type command is received can be shortened.

Also, a buffer and a signal transmission circuit according to the present invention can be applied to a semiconductor memory device having an operation delay function of a CAS command according to the present invention.

Although the invention has been described with reference to a particular embodiment, it will be apparent to one of ordinary skill in the art that modifications of the described embodiment may be made without departing from the spirit and scope of the invention.

What is claimed is:

1. A signal transmission circuit for transmitting a received signal, comprising:
   a plurality of transmission units each having a different number of delay clock cycles, for delaying and transmitting the received signal,
   wherein at least one of the transmission units comprises:
   a transmission switch for transmitting the received signal in response to a corresponding control signal; and
   a clock delay unit which is enabled in response to the control signal, and delays a signal received from the transmission switch for the delay clock cycles and transmits the delayed signal in response to a predetermined clock signal.

2. The signal transmission circuit of claim 1, wherein the transmission unit further comprises a latch unit and a delay unit between the transmission switch and the clock delay unit, wherein the latch unit latches the received signal output from the transmission switch and the delay unit delays the received signal.

3. The signal transmission circuit of claim 1, wherein the clock delay unit comprises:
   a first transmission gate which is enabled in response to the control signal and gated in response to the first state of the clock signal, to transmit the received signal output from the transmission switch;
   a first latch for latching a signal received from the first transmission gate;
   a second transmission gate which is enabled in response to the control signal and gated in response to the second state of the clock signal, to transmit a signal latched by the first latch;
   a second latch for latching a signal received from the second transmission gate; and
   a third transmission gate which is enabled in response to the control signal and gated in response to the first state of the clock signal, to transmit a signal latched by the second latch.

4. The signal transmission circuit of claim 1, wherein the transmission unit further comprises a latch unit and a delay unit between the transmission switch and the clock delay unit, wherein the latch unit latches the received signal output from the transmission switch and the delay unit delays the received signal.

5. An integrated circuit memory device, comprising:
   a mode register set circuit; and
   a buffer having a signal transmission unit therein for delaying a signal received by said buffer for a predetermined number of clock cycles and transmitting the delayed signal, wherein the number of clock cycles is determined in response to predetermined control signals that are generated by said mode register set circuit;
   wherein the signal transmission unit comprises a plurality of transmission units each having a delay associated therewith and at least one of the transmission units comprises:
   a transmission switch for transmitting the received signal in response to a corresponding control signal; and
   a clock delay unit which is enabled in response to the control signal, and delays the signal received from the transmission switch for the predetermined number of clock cycles and transmits the delayed signal received from the transmission switch in response to a predetermined clock signal.

6. The buffer of claim 5, wherein the clock delay unit comprises:
   a first transmission gate which is enabled in response to the control signal and gated in response to the first state of the clock signal, to transmit the received signal output from the transmission switch;
   a first latch for latching a signal received from the first transmission gate;
   a second transmission gate which is enabled in response to the control signal and gated in response to the second state of the clock signal, to transmit a signal latched by the first latch;
   a second latch for latching a signal received from the second transmission gate; and
   a third transmission gate which is enabled in response to the control signal and gated in response to the first state of the clock signal, to transmit a signal latched by the second latch.

7. A semiconductor memory device comprising:
   a mode set register for programming the delay time from when a row address strobe (RAS) command is input to when a column address strobe (CAS) command is input and providing a plurality of control signals, wherein one among the plurality of control signals is activated corresponding to the delay time;
   a /CAS buffer for receiving and buffering a predetermined /CAS signal, wherein the /CAS signal is delayed for a predetermined number of delay clock cycles in response to the control signal;
   a /CS buffer for receiving and buffering a predetermined /CS signal, wherein the /CS signal is delayed for the number of delay clock cycles in response to the control signal; and
   a /WE buffer for receiving and buffering a predetermined /WE signal, wherein the /WE signal is delayed for the number of delay clocks in response to the control signal.

8. The semiconductor memory device of claim 7, wherein each of the /CAS buffer, the /CS buffer and the /WE buffer comprises a plurality of transmission units each having a different number of delay clock cycles, for delaying and transmitting a received signal, and at least one of the transmission units comprises:
   a transmission switch for transmitting the received signal in response to a corresponding control signal; and a clock delay unit which is enabled in response to the control signal, and delays the received signal received from the transmission switch for the delay clock cycles and transmits the delayed signal in response to a predetermined clock signal.

9. The semiconductor memory device of claim 8, wherein the clock delay unit comprises:

a first transmission gate which is enabled in response to the control signal and gated in response to the first state of the clock signal, to transmit the received signal output from the transmission switch;

a first latch for latching a signal received from the first transmission gate;

a second transmission gate which is enabled in response to the control signal and gated in response to the second state of the clock signal, to transmit a signal latched by the first latch;

a second latch for latching a signal received from the second transmission gate; and a third transmission gate which is enabled in response to the control signal and gated in response to the first state of the clock signal, to transmit a signal latched by the second latch.

10. An integrated circuit memory device, comprising:

a control circuit that preserves a minimum row address strobe to column address strobe delay ($tRCD_{min}$) within the memory device by generating an internal column-type command that is delayed by at least $tRCD_{min}$ relative to a corresponding external row-type command, in response to the external row-type command, an external column-type command that is delayed relative to the external row-type command by less than $tRCD_{min}$ and at least one control signal that specifies a time interval by which the external column-type command is to be delayed.

11. The memory device of claim 10, wherein the at least one control signal specifies the time interval as an integer number of periods of an internal clock signal by which the internal column-type command is delayed relative to the external column-type command.

12. The memory device of claim 11, wherein said control circuit comprises:

a column-type command signal buffer that generates an initial column-type command in response to the at least one control signal, an internal clock signal and the external column-type command; and an internal column-type command signal generator that generates an internal column-type command in response to the initial column-type command, the internal clock signal and an internal chip select signal.

13. The memory device of claim 12, further comprising a row-type command signal buffer that generates an initial row-type command in response to the external row-type command; and wherein said internal column-type command signal generator is responsive to the initial row-type command.

14. The memory device of claim 13, further comprising:

a chip-select signal buffer that generates an initial chip select signal in response to the at least one control signal, the internal clock signal and an external chip select signal; and an internal chip select signal generator that generates the internal chip select signal in response to the initial chip select signal and the internal clock signal.

15. The memory device of claim 10, further comprising a mode set register that generates the at least one control signal.

16. The memory device of claim 10, wherein said control circuit is responsive to an external chip select signal (/CS); wherein the external column-type command is either an external column address strobe signal (/CAS) or an external write enable signal (/WE); and wherein the external row-type command is a row-address strobe signal (/RAS).

17. The memory device of claim 10, wherein said control circuit comprises:

a column-type command signal buffer that generates an initial column-type command in response to the at least one control signal, an internal clock signal and the external column-type command; and an internal column-type command signal generator that generates an internal column-type command in response to the initial column-type command, the internal clock signal and an internal chip select signal.

18. The memory device of claim 17, further comprising a row-type command signal buffer that generates an initial row-type command in response to the external row-type command; and wherein said internal column-type command signal generator is responsive to the initial row-type command.

19. The memory device of claim 18, further comprising:

a chip-select signal buffer that generates an initial chip select signal in response to the at least one control signal, the internal clock signal and an external chip select signal; and an internal chip select signal generator that generates the internal chip select signal in response to the initial chip select signal and the internal clock signal.

20. The memory device of claim 19, further comprising a mode set register that generates the at least one control signal.

* * * * *